(12) United States Patent
Sakamoto

(10) Patent No.: US 10,319,786 B2
(45) Date of Patent: Jun. 11, 2019

(54) MEMORY DEVICE

(71) Applicant: TOSHIBA MEMORY CORPORATION, Minato-ku, Tokyo (JP)

(72) Inventor: Kei Sakamoto, Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/909,579

(22) Filed: Mar. 1, 2018

(65) Prior Publication Data

US 2019/0088718 A1 Mar. 21, 2019

(30) Foreign Application Priority Data

Sep. 19, 2017 (JP) ................. 2017-178986

(51) Int. Cl.
*H01L 29/792* (2006.01)
*H01L 27/24* (2006.01)
(Continued)

(52) U.S. Cl.
CPC ...... *H01L 27/2454* (2013.01); *G11C 11/5685* (2013.01); *G11C 13/003* (2013.01); *G11C 13/0007* (2013.01); *G11C 13/0069* (2013.01); *G11C 13/0097* (2013.01); *H01L 27/2481* (2013.01); *H01L 45/1253* (2013.01); *H01L 45/1683* (2013.01)

(58) Field of Classification Search
CPC ............ G11C 11/5685; G11C 13/0007; G11C 13/0069; G11C 11/56; G11C 13/00; H01L 27/101; H01L 45/08; H01L 45/1233; H01L 45/146; H01L 45/1625; H01L 27/11529; H01L 27/2481; H01L 29/7926; H01L 27/1052; H01L 27/24; H01L 45/00
See application file for complete search history.

(56) References Cited

U.S. PATENT DOCUMENTS 8,582,341 B2 11/2013 Fukuzumi et al.
8,822,966 B2 * 9/2014 Takahashi ............... H01L 45/14
257/1

(Continued)

FOREIGN PATENT DOCUMENTS

JP 2012-018989 A 1/2012
JP 2015-109426 A 6/2015

*Primary Examiner* — Roy K Potter
(74) *Attorney, Agent, or Firm* — Foley & Lardner LLP

(57) ABSTRACT

A memory device includes: a wiring; an electrode that includes a first portion provided on the wiring, and a second portion provided on the first portion; a first pillar and a second pillar that are provided inside the second portion; a first conductive layer that is provided below the first pillar; and a second conductive layer that is provided below the second pillar. The second portion includes a first conductive portion provided around the first pillar and including a first conductive material, a second conductive portion provided around the second pillar and containing the first conductive material, and a third conductive portion provided around the first and second conductive portions, containing a second conductive material, and electrically connected to the first portion and the first and second conductive portions. The first portion includes the second conductive material.

14 Claims, 7 Drawing Sheets

(51) Int. Cl.
    *G11C 13/00*    (2006.01)
    *G11C 11/56*    (2006.01)
    *H01L 45/00*    (2006.01)

(56) References Cited

U.S. PATENT DOCUMENTS

| | | |
|---|---|---|
| 8,900,965 B2 | 12/2014 | Sorada et al. |
| 9,281,345 B2 | 3/2016 | Kanno et al. |
| 2012/0043518 A1* | 2/2012 | Cheng ............... C23C 16/26 257/4 |
| 2012/0241842 A1* | 9/2012 | Matsuda ........ H01L 21/28282 257/324 |
| 2014/0077144 A1* | 3/2014 | Yoneda ............. H01L 45/145 257/2 |
| 2017/0040336 A1* | 2/2017 | Lee ..................... H01L 28/00 |
| 2017/0194337 A1* | 7/2017 | Lee ................ H01L 27/11519 |

* cited by examiner

MEMORY DEVICE

CROSS-REFERENCE TO RELATED APPLICATION

This application is based on and claims priority to Japanese Patent Application No. 2017-178986, filed Sep. 19, 2017, the entire contents of which are incorporated herein by reference.

FIELD

One or more embodiments described herein relate generally to a memory device.

BACKGROUND

Two-terminal resistive random access memories can be used as large-capacitance nonvolatile memories. Such types of memory are capable of low-voltage and low-current operations, high-speed switching, and micronization and high integration of memory cells. Various materials have been proposed as variable resistance layers for resistive random access memories.

In large-capacitance memory arrays, a plurality of metal wirings called bit lines and word lines are disposed to intersect each other and memory cells are formed at intersections of the bit lines and the word lines. A memory cell is written by applying a voltage to a bit line BL and a word line WL connected to the cell.

DETAILED DESCRIPTION

Figure 1:
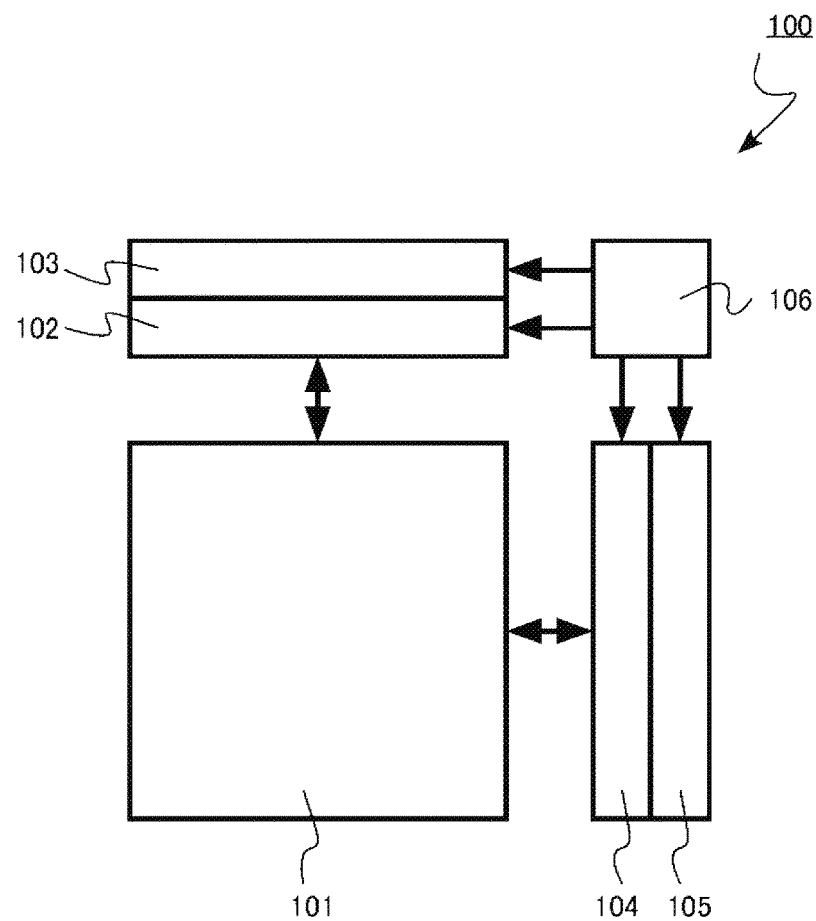
FIG. 1 is a block diagram illustrating a memory device according to one or more embodiments.

One or more example embodiments provide for a memory device capable of reducing contact resistance.

In general, according to one embodiment, a memory device includes: a wiring; an electrode that includes a first portion provided on the wiring and electrically connected to the wiring and a second portion provided on and electrically connected to the first portion; a first pillar provided inside the second portion; a second pillar provided inside the second portion; a first conductive layer provided below the first pillar, extending in a first direction, and electrically connected to the first pillar; and a second conductive layer provided below the second pillar, extending in the first direction, and electrically connected to the second pillar. The second portion of the electrode includes a first conductive portion provided around the first pillar and including a first conductive material, a second conductive portion provided around the second pillar and including the first conductive material, and a third conductive portion provided around the first and second conductive portions, including a second conductive material, and electrically connected to the first portion and the first and second conductive portions. The first portion of the electrode includes the second conductive material.

Hereinafter, embodiments will be described with reference to the drawings. Throughout the drawings, same reference numerals may be assigned to same or similar components.

First Aspect

According to a first aspect, a memory device includes: a wiring; an electrode that includes a first portion provided on the wiring and electrically connected to the wiring and a second portion provided on the first portion and electrically connected to the first portion; a first pillar provided inside the second portion; a second pillar provided inside the second portion; a first conductive layer provided below the first pillar, extends in a first direction, and is electrically connected to the first pillar; and a second conductive layer provided below the second pillar, extends in the first direction, and is electrically connected to the second pillar. The second portion of the electrode includes a first conductive portion provided around the first pillar and including a first conductive material, a second conductive portion provided around the second pillar and including the first conductive material, and a third conductive portion provided around the first and second conductive portions, including a second conductive material, and electrically connected to the first portion and the first and second conductive portions. The first portion of the electrode includes the second conductive material.

Figure 2:
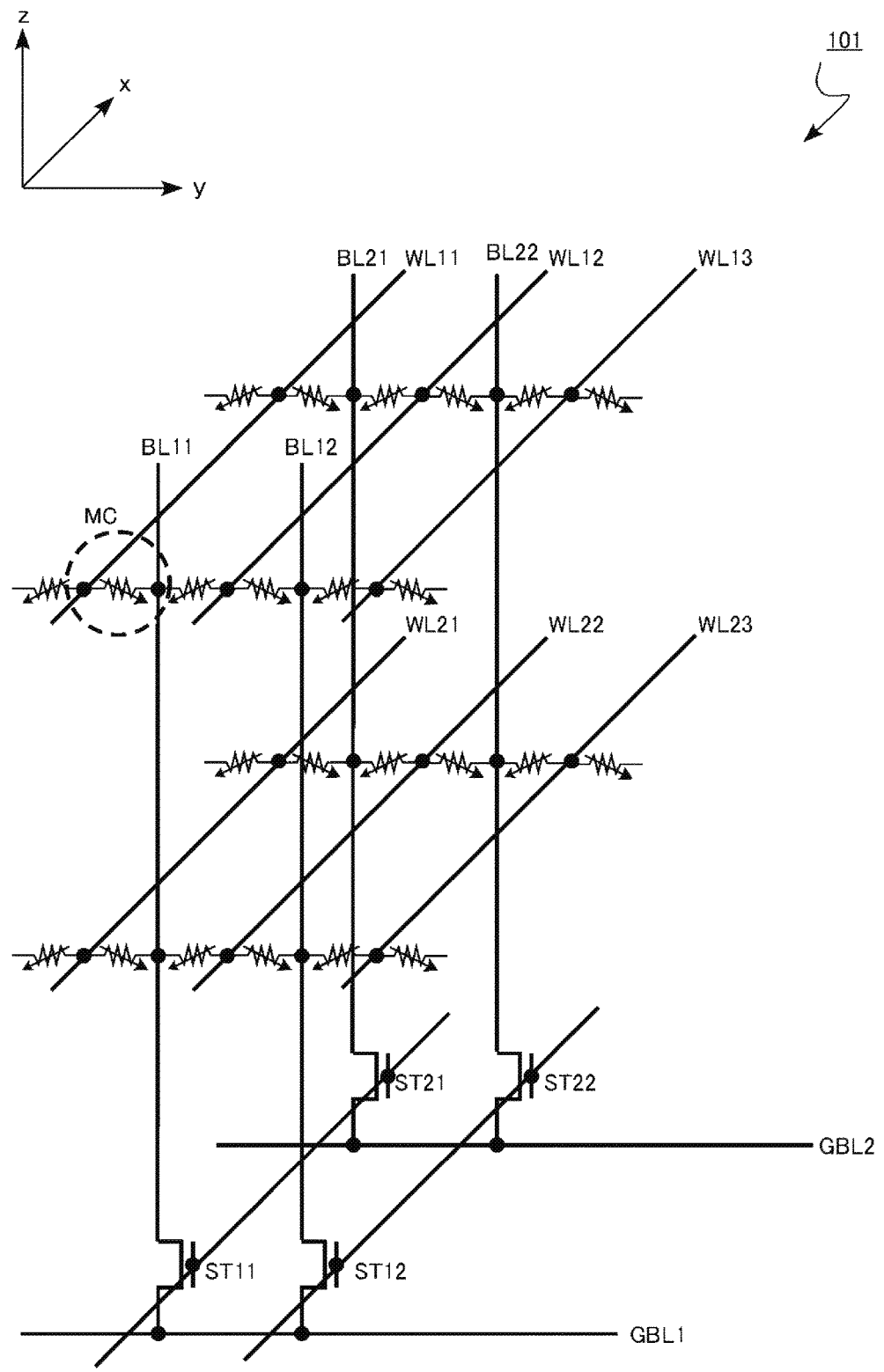
FIG. 2 is an equivalent circuit diagram illustrating a memory cell array according to one or more embodiments.

FIG. 1 is a block diagram illustrating a memory device 100 according to one or more embodiments. FIG. 2 is an equivalent circuit diagram illustrating a memory cell array 101. FIG. 2 schematically illustrates a wiring structure in the memory cell array.

The memory device 100 according to one or more embodiments is a resistive random access memory. The resistive random access memory stores data using a resistance change of a variable resistance layer accompanied with an application of a voltage.

The memory cell array 101 according to one or more embodiments has a 3-dimensional structure in which memory cells are disposed 3-dimensionally. When the memory cell array 101 has the 3-dimensional structure, integration of the memory device 100 can be improved.

As illustrated in FIG. 1, the memory device 100 includes the memory cell array 101, a word line driver circuit 102, a row decoder circuit 103, a sense amplifier 104, a column decoder circuit 105, and a control circuit 106.

As illustrated in FIG. 2, a plurality of memory cells MCs are disposed 3-dimensionally inside the memory cell array 101. In FIG. 2, a region surrounded by a dashed line corresponds to one memory cell MC.

The memory cell array 101 includes, for example, a plurality of word lines WLs (e.g. WL11, WL12, WL13, WL21, WL22, and WL23) and a plurality of bit lines BLs (e.g. BL11, BL12, BL21, and BL22). The word lines WLs extend in an x-direction. The bit lines BLs extend in a z-direction. The word lines WLs and the bit lines BLs intersect each other vertically. The memory cells MCs are disposed at intersections between the word lines WLs and the bit lines BLs.

A y-direction is an example of a first direction and the z-direction is an example of a second direction. The y-direction, the z-direction, and the x-direction may be orthogonal to each other.

The plurality of word lines WL are electrically connected to the row decoder circuit 103. The plurality of bit lines BLs are connected to the sense amplifier 104. Select transistors STs (ST11, ST21, ST12, and ST22) and global bit lines GBLs (GBL1 and GBL2) are provided between the plurality of bit lines BLs and the sense amplifier 104.

The row decoder circuit 103 is configured to select the word line WL in accordance with an input row address signal. The word line driver circuit 102 is configured to apply a predetermined voltage to the word line WL selected by the row decoder circuit 103.

The column decoder circuit 105 is configured to select the bit line BL in accordance with an input column address signal. The sense amplifier 104 is configured to apply a predetermined voltage to the bit line BL selected by the column decoder circuit 105. The sense amplifier 104 is configured to amplify and detect a current flowing between the selected word line WL and the selected bit line BL.

The control circuit 106 is configured to control the word line driver circuit 102, the row decoder circuit 103, the sense amplifier 104, the column decoder circuit 105, and/or other circuits (not illustrated).

Circuits such as the word line driver circuit 102, the row decoder circuit 103, the sense amplifier 104, the column decoder circuit 105, and the control circuit 106 are electronic circuits. For example, the circuits are configured with transistors or wiring layers using semiconductor layers (not illustrated).

Figure 3A:
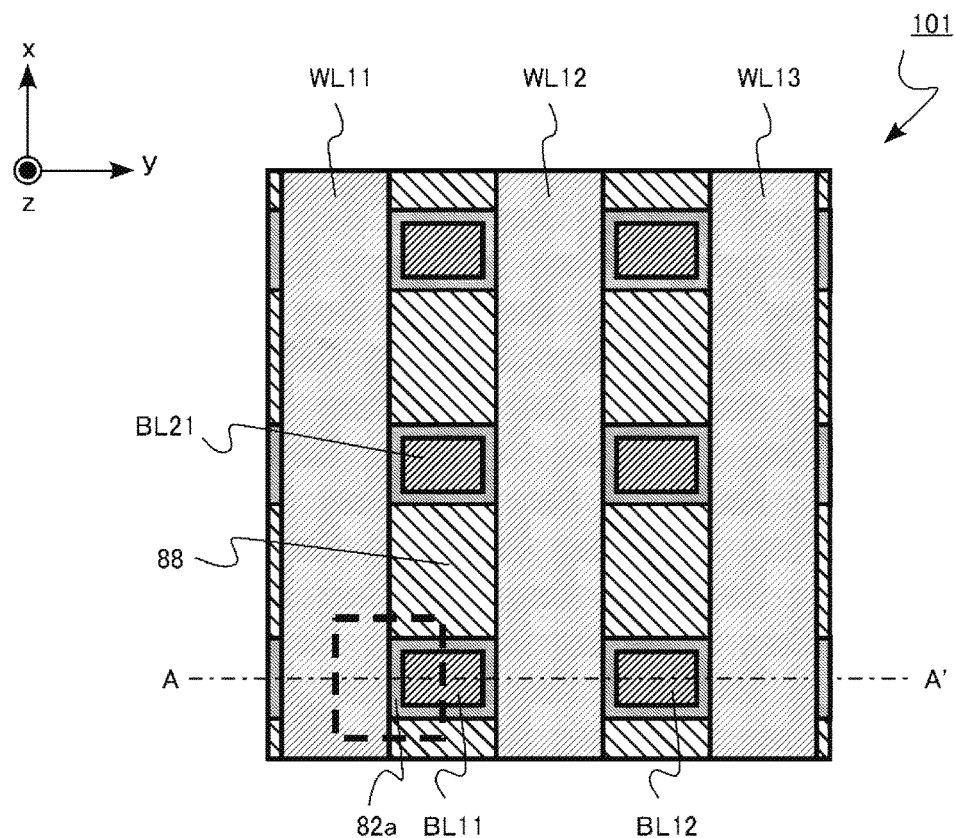
FIGS. 3A and 3B are schematic sectional views illustrating a memory cell of the memory device according to one or more embodiments.
Figure 3B:
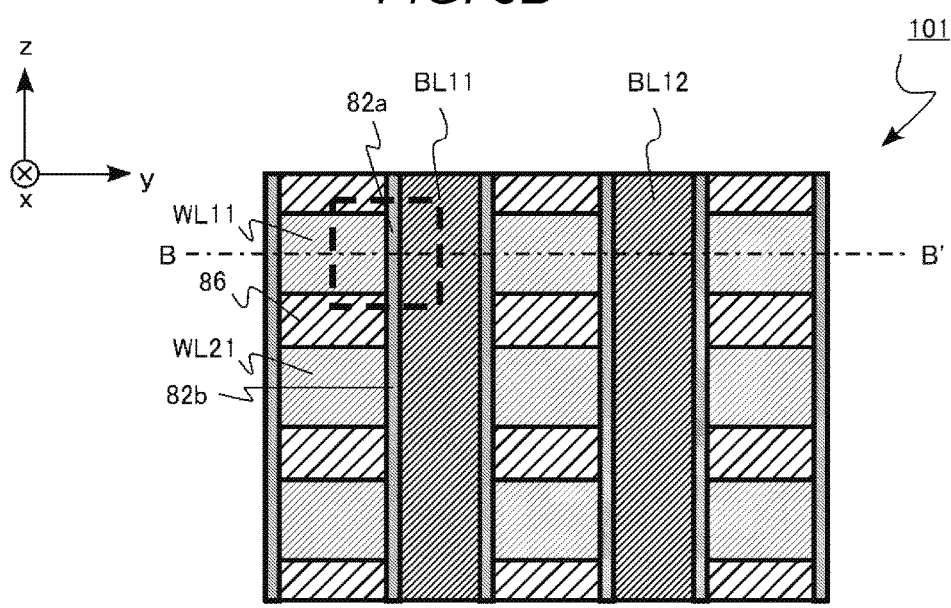

FIGS. 3A and 3B are schematic sectional views illustrating the memory cell array 101 of the memory device 100 according to one or more embodiments. FIG. 3A is an xy-sectional view illustrating the memory cell array 101. FIG. 3B is a yz-sectional view illustrating the memory cell array 101. FIG. 3A is a sectional view taken along the line B-B' of FIG. 3B and FIG. 3B is a sectional view taken along the line A-A' of FIG. 3A. In FIGS. 3A and 3B, a region surrounded by a dashed line defines one memory cell MC.

The memory cell array 101 includes the word line WL11, the word line WL21, the word line WL12, the word line WL13, the bit line BL11, the bit line BL21, and the bit line BL12. The memory cell array 101 further includes a first variable resistance layer 82a, a second variable resistance layer 82b, an interlayer insulating layer 86, and an interlayer insulating layer 88.

Hereinafter, the term word lines WLs may be used to refer to the word line WL11, the word line WL21, the word line WL12, the word line WL13, and the like in some cases. The term bit lines BLs may be used to refer to the bit line BL11, the bit line BL21, the bit line BL12, and the like in some cases.

The word lines WLs are conductive layers. The word lines WLs are, for example, metal layers. The word lines WLs include, for example, tungsten (W) or titanium nitride (TiN). The word lines WLs may be formed of a conductive material such as another metal, a metal semiconductor compound, or a semiconductor.

The bit lines BLs are conductive layers. The bit lines BLs are, for example, metal layers. The bit lines BLs include, for example, tungsten (W), titanium nitride (TiN), or copper (Cu). The bit lines BLs may be formed of a conductive material such as another metal, a metal semiconductor compound, or a semiconductor.

The pitch of the word line WL in the y-direction is, for example, about 50 nanometers (nm) or more and/or about 200 nm or less. The thickness of the word line WL in the z-direction is, for example, about 30 nm or less. The pitch of the bit line BL in the x-direction is, for example, about 50 nm or more and/or about 200 nm or less.

The pitch of the word line WL in the y-direction, the thickness of the word line WL in the z-direction, and the pitch of the bit line BL in the x-direction can be measured by observing them with, for example, a transmission electron microscope.

The interlayer insulating layers 86 are provided between the word line WL11 and the word line WL21 and between the bit line BL11 and the bit line BL12. The interlayer insulating layers 88 are provided between the word line WL11 and the word line WL12 and between the bit line BL11 and the bit line BL21. The interlayer insulating layers 86 and 88 are formed of, for example, an oxide, an oxynitride, or a nitride. The interlayer insulating layers 86 and 88 are formed of, for example, a silicon oxide.

The thickness of the interlayer insulating layer 86 in the z-direction is, for example, about 30 nm or less. The thickness of the interlayer insulating layer 86 in the z-direction is, for example, thinner than the thickness of the word line WL11 in the z-direction.

The first variable resistance layer 82a is provided between the word line WL11 and the bit line BL11. The second variable resistance layer 82b is provided between the word line WL21 and the bit line BL11. A variable resistance layer is provided between the bit line BL11 and the bit line BL12.

The first variable resistance layer 82a and the second variable resistance layer 82b are physically connected. In one or more embodiments, the first variable resistance layer 82a and the second variable resistance layer 82b may be portions of a single variable resistance layer. The first variable resistance layer 82a and the second variable resistance layer 82b are continuous. In one or more embodiments, the first variable resistance layer 82a and the second variable resistance layer 82b may be physically separated from each other.

The first variable resistance layer 82a and the second variable resistance layer 82b have a function of storing data using a change in a resistance state. The first variable resistance layer 82a and the second variable resistance layer 82b can rewrite data by applying a voltage or a current. The first variable resistance layer 82a and the second variable resistance layer 82b transition between a high resistance state (e.g. a reset state) and a low resistance state (e.g. a set state) by applying a voltage or a current. For example, the high resistance state is defined as data of "0" and the low resistance state is defined as data of "1." The memory cell MC stores 1-bit data of "0" and "1."

The first variable resistance layer 82a and the second variable resistance layer 82b are formed of, for example, chalcogenide including germanium (Ge), antimony (Sb), and tellurium (Te), a binary system transition metal oxide such as NiO or $TiO_2$, a solid electrolyte such as GeS or CuS, or a perovskite-type oxide such as $Pr_{0.7}Ca_{0.3}MnO_3$ or $SrTiO_3$.

The film thicknesses of the first variable resistance layer 82a and the second variable resistance layer 82b are, for example, about 3 nm or more and/or about 20 nm or less.

Seed layers may be provided in the first variable resistance layer 82*a* and the second variable resistance layer 82*b*. The seed layers have a function of accelerating formation of the first variable resistance layer 82*a* and the second variable resistance layer 82*b*.

Rectification layers (not illustrated) that rectify a current flowing in a film thickness direction may be provided between the word line WL11 and the first variable resistance layer 82*a*, between the word line WL11 and the interlayer insulating layer 86, between the word line WL21 and the second variable resistance layer 82*b*, and/or between the word line WL21 and the interlayer insulating layer 86.

Figure 4A:
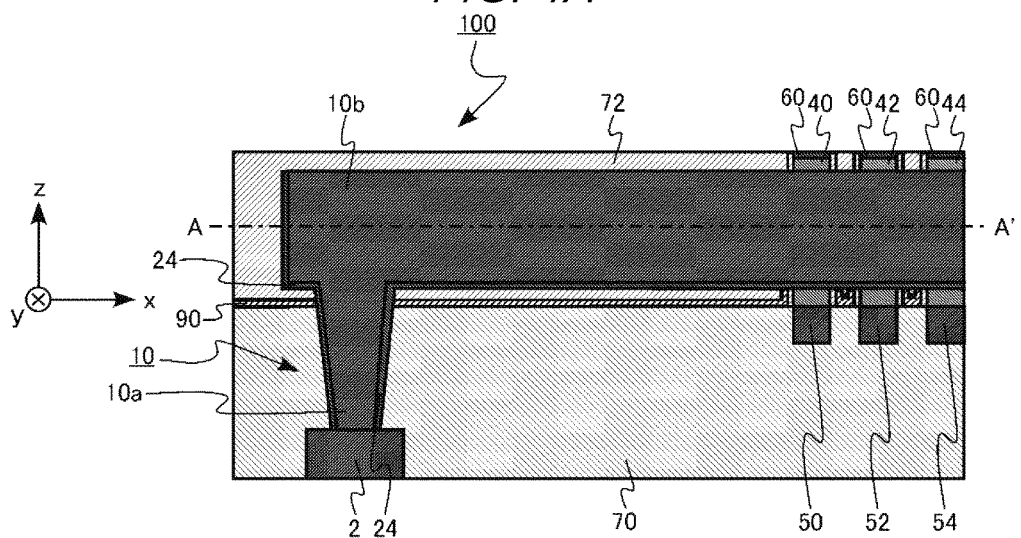
FIGS. 4A and 4B are schematic sectional views illustrating one or more select transistor units of the memory device according to one or more embodiments.
Figure 4B:
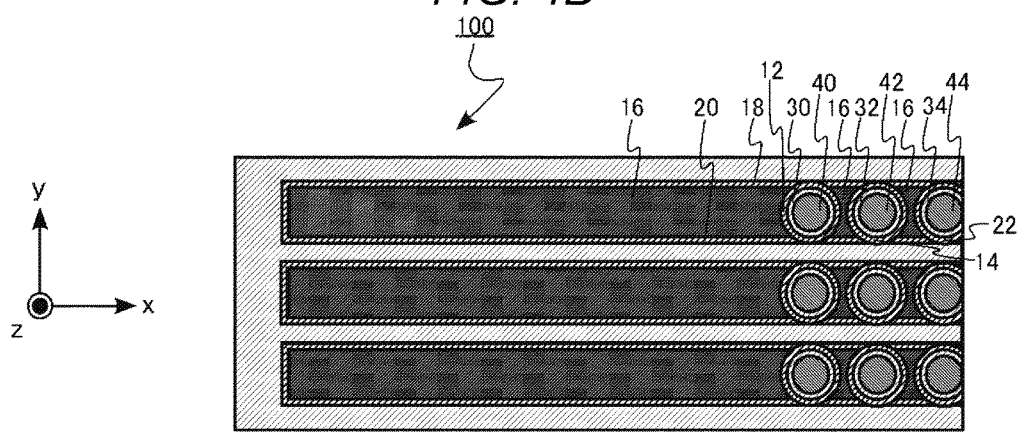

FIGS. 4A and 4B are schematic sectional views illustrating one or more select transistor units of the memory device 100 according to one or more embodiments. FIG. 4A is an xz-sectional view illustrating the select transistor unit of the memory device 100 according to one or more embodiments and FIG. 4B is a sectional view taken along the line A-A' in the select transistor unit of the memory device 100 according to one or more embodiments.

A wiring 2 is connected to the sense amplifier 104 and is used to apply a gate drive voltage of the select transistor. The wiring 2 includes, for example, a metal material.

The memory device 100 includes an electrode 10 including a first portion 10*a* and a second portion 10*b*. The first portion 10*a* is provided on the wiring 2 and is electrically connected to the wiring 2. The second portion 10*b* is provided on, and is electrically connected to, the first portion 10*a*.

A first pillar 40 is provided inside the second portion 10*b*. The first pillar 40 includes the select transistor ST11. The first pillar 40 includes, for example, polycrystalline silicon. The select transistor ST11 is a thin film transistor (TFT) formed by implanting p-type impurities and n-type impurities into polycrystalline silicon.

A second pillar 42 is provided inside the second portion 10*b*. The second pillar 42 includes the select transistor ST21. The second pillar 42 includes, for example, polycrystalline silicon. The select transistor ST21 is a thin film transistor (TFT) formed by implanting p-type impurities and n-type impurities into polycrystalline silicon.

A third pillar 44 is provided inside the second portion 10*b*. The second pillar 42 is provided between the first pillar 40 and the third pillar 44. The third pillar 44 includes a select transistor ST31. The third pillar 44 includes, for example, polycrystalline silicon. The select transistor ST31 is a thin film transistor (TFT) formed by implanting p-type impurities and n-type impurities into polycrystalline silicon.

A first conductive layer 50 is provided below the first pillar 40, extends in the y-direction, and is electrically connected to the first pillar 40. The first conductive layer 50 is, or defines a portion of, GBL1.

A second conductive layer 52 is provided below the second pillar 42, extends in the y-direction, and is electrically connected to the second pillar 42. The second conductive layer 52 is, or defines a portion of, GBL2.

A fifth conductive layer 54 (a third conductive layer and a fourth conductive layer are described below) is provided below the third pillar 44, extends in the y-direction, and is electrically connected to the third pillar 44. The fifth conductive layer 54 is, or defines a portion of, GBL3.

The second portion 10*b* of the electrode 10 includes a first conductive portion 12 that is provided around the first pillar 40 and includes a first conductive material, a second conductive portion 14 that is provided around the second pillar and includes the first conductive material, a sixth conductive portion 22 that is provided around the third pillar 44 and includes the first conductive material, and a third conductive portion 16 that is provided around the first conductive portion 12, the second conductive portion 14, and the sixth conductive portion 22, the third conductive portion 16 including a second conductive material and electrically connected to the first portion 10*a* of the electrode 10, the first conductive portion 12, the second conductive portion 14, and the sixth conductive portion 22. The first portion 10*a* of the electrode 10 includes the second conductive material.

The first conductive material may include titanium nitride. The second conductive material may include tungsten.

The second portion 10*b* of the electrode 10 further includes a fourth conductive portion 18 that is electrically connected to the first conductive portion 12, the second conductive portion 14, the third conductive portion 16, and the sixth conductive portion 22, and includes the first conductive material. The second portion 10*b* of the electrode 10 further includes a fifth conductive portion 20 that is electrically connected to the first conductive portion 12, the second conductive portion 14, the third conductive portion 16, and the sixth conductive portion 22 and includes the first conductive material. The first pillar 40, the second pillar 42, the first conductive portion 12, the second conductive portion 14, the third conductive portion 16, and the sixth conductive portion 22 are provided between the fourth conductive portion 18 and the fifth conductive portion 20.

The first portion 10*a* and the second portion 10*b* may include, for example, a conductive material such as a polycrystalline silicon.

A first gate insulating film 30 is provided between the first pillar 40 and the first conductive portion 12. A second gate insulating film 32 is provided between the second pillar 42 and the second conductive portion 14. A third gate insulating film 34 is provided between the third pillar 44 and the sixth conductive portion 22. The first gate insulating film 30, the second gate insulating film 32, and the third gate insulating film 34 are gate insulating films of the select transistor ST11, the select transistor ST21, and the select transistor ST31, respectively. The first gate insulating film 30, the second gate insulating film 32, and the third gate insulating film 34 include, for example, a silicon oxide.

A first insulator 70 is provided around the wiring 2, the first portion 10*a*, the first conductive layer 50, the second conductive layer 52, and the fifth conductive layer 54. The first insulator 70 includes, for example, a silicon oxide.

A second insulator 72 is provided on the first insulator 70 and around the first pillar 40, the second pillar 42, the third pillar 44, the first conductive portion 12, the second conductive portion 14, the third conductive portion 16, the fourth conductive portion 18, the fifth conductive portion 20, and the sixth conductive portion 22. The second insulator 72 includes, for example, a silicon oxide.

A seventh conductive portion 24 includes the first conductive material and is provided between the electrode 10 and the first insulator 70 and between the electrode 10 and the second insulator. The seventh conductive portion 24 is a barrier metal layer.

The BL11, which may be a third conductive layer, is electrically connected to the first pillar 40 and extends in the z-direction intersecting the y-direction and is provided on the first pillar 40. The BL12, which may be a fourth conductive layer, is electrically connected to the second pillar 42 and extends in the z-direction and is provided on the second pillar 42. A BL13 that is electrically connected to the third pillar 44 and extends in the z-direction is provided on the third pillar 44 (see FIG. 3B).

Between the BL11 and the BL12 (see FIG. 3B), variable resistance layers (e.g. the first variable resistance layer 82a and the second variable resistance layer 82b) are provided, and between the BL12 and BL13, variable resistance layers (not illustrated) are provided.

Conductive layers 60 that include, for example, the first conductive material may be provided between the first pillar 40 and the BL11, between the second pillar 42 and the BL12, and between the third pillar 44 and the BL13. The conductive layer 60 is used as a barrier metal layer.

A stopper 90 is provided between the first insulator 70 and the second insulator 72. For example, the stopper 90 includes silicon nitride (SiN) and is used as an etching stopper.

Next, a method of manufacturing the memory device according to one or more embodiments will be described.

FIGS. 5A and 5B, 6A and 6B, and 7A and 7B are schematic sectional views illustrating the memory device being manufactured by the method of manufacturing the memory device according to one or more embodiments.

A method of manufacturing a memory device according to one or more embodiments includes: forming a wiring; forming a first insulator on the wiring; forming a first conductive layer extending in a first direction on the first insulator; forming a second conductive layer extending in the first direction on the first insulator; forming a first pillar electrically connected to the first conductive layer on the first conductive layer; forming a second pillar electrically connected to the second conductive layer on the second conductive layer; forming a second insulator around the first and second pillars; forming a hole penetrating through the first and second insulators to expose the wiring; removing parts of the second insulator around the first and second pillars and around the hole; forming a first conductive portion including the first conductive material around the first pillar; forming a second conductive portion including the first conductive material around the second pillar; and forming an electrode which includes a first portion and a second portion, wherein the first portion is provided on the wiring and includes the second conductive material and is electrically connected to the wiring, and the second portion is provided on the first portion and includes a third conductive portion electrically connected to the first portion, includes the second conductive material, and is electrically connected to the first and second conductive portions, and wherein the electrode is formed such that the first and second pillars are provided inside the second portion of the electrode.

In the method of manufacturing the above-described memory device, when the electrode 10 is formed, the fourth and fifth conductive portions electrically connected to the first, second, and third conductive portions and including the first conductive material can be formed so that the first pillar, the second pillar, the first conductive portion, the second conductive portion, and the third conductive portion are provided between the fourth and fifth conductive portions.

Figure 5A:
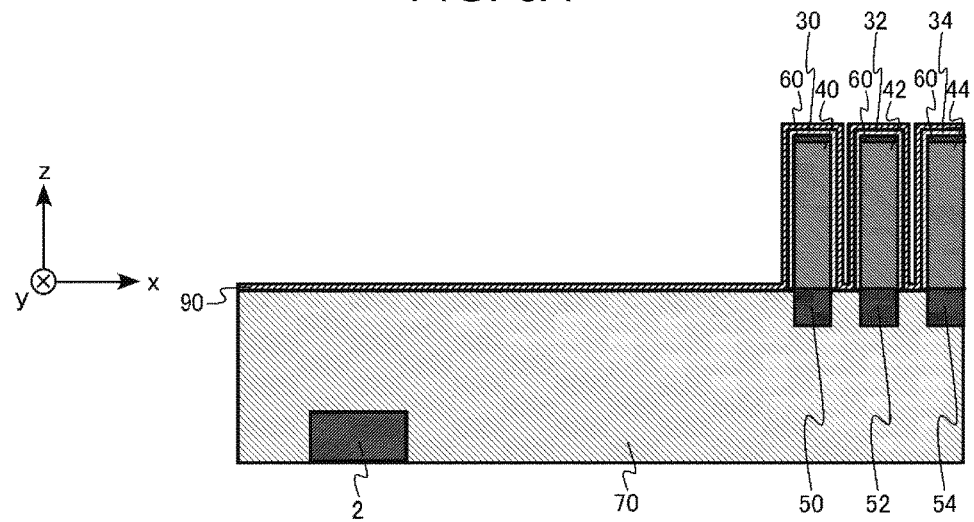
FIGS. 5A and 5B are schematic sectional views illustrating the memory device being manufactured by a method of manufacturing the memory device according to one or more embodiments.

As shown in FIG. 5A, the wiring 2 is formed. The wiring 2 includes, for example, a metal material. The first insulator 70 is formed on the wiring 2. A part on the first insulator 70 is removed by etching or the like to form a space and the first conductive layer 50, the second conductive layer 52, and the fifth conductive layer 54 extending in the y-direction are formed in the space.

Polycrystalline silicon is formed on the first insulator 70, the first conductive layer 50, the second conductive layer 52, and the fifth conductive layer 54. The conductive layers 60 including, for example, the first conductive material are formed on the polycrystalline silicon. The conductive layers 60 and the polycrystalline silicon other than the parts on the first conductive layer 50, the second conductive layer 52, and the fifth conductive layer 54 are removed to form the first pillar 40, the second pillar 42, and the third pillar 44. The p-type impurities and the n-type impurities are introduced into the first pillar 40, the second pillar 42, and the third pillar 44, for example, by ion implantation to form the thin film transistors (TFT) in the first pillar 40, the second pillar 42, and the third pillar 44.

Figure 5B:
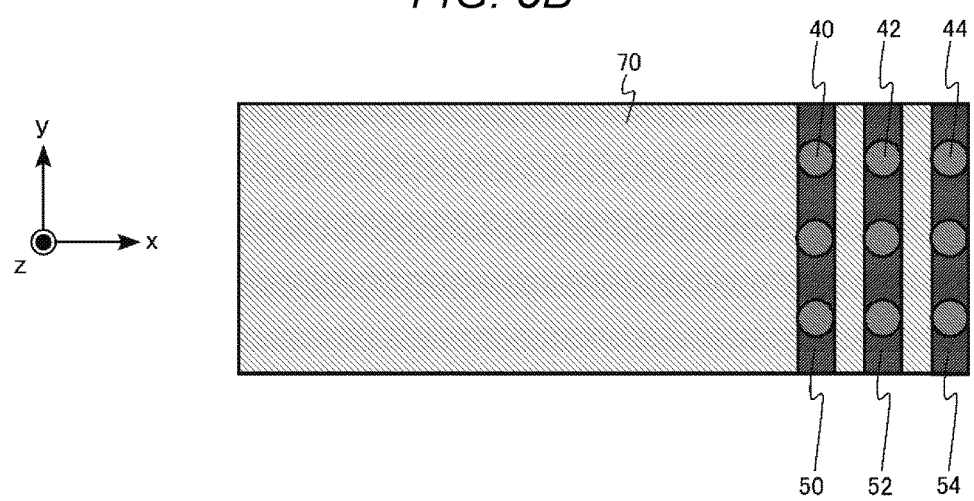

Insulating films including a silicon oxide are formed around the first pillar 40, the second pillar 42, and the third pillar 44. Thus, the first gate insulating film 30 is formed around the first pillar 40, the second gate insulating film 32 is formed around the second pillar 42, and the third insulating film 34 is formed around the third pillar 44. The stopper 90 including, for example, silicon nitride is formed on the first insulator 70, the first gate insulating film 30, the second gate insulating film 32, the third gate insulating film 34, and the conductive layers 60. FIG. 5A is a schematic sectional view illustrating one or more embodiments of the memory device which is being manufactured. FIG. 5B is a schematic view illustrating the first insulator 70, the first conductive layer 50, the second conductive layer 52, the fifth conductive layer 54, the first pillar 40, the second pillar 42, and the third pillar 44 when the memory device which is being manufactured, as illustrated in FIG. 5A, is viewed in the z-direction.

Figure 6A:
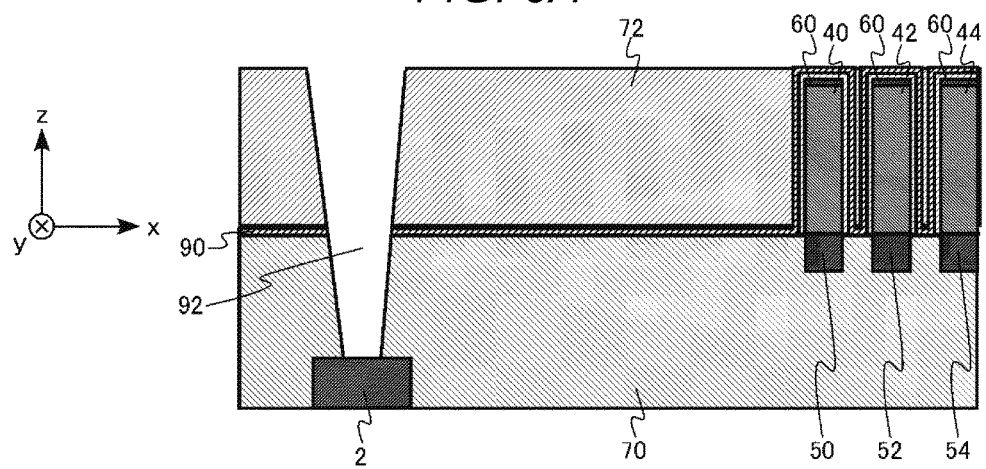
FIGS. 6A and 6B are schematic sectional views illustrating the memory device being manufactured by the method of manufacturing the memory device according to one or more embodiments.
Figure 6B:
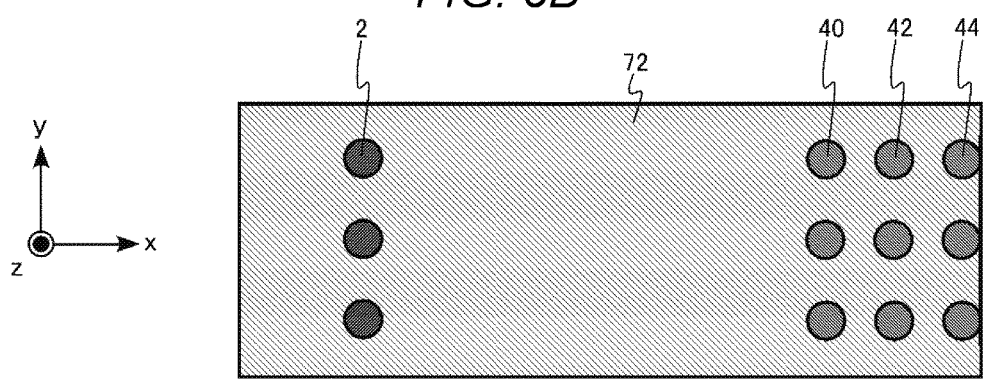

Referring now to FIG. 6A and FIG. 6B, the second insulator 72 is formed around the first pillar 40, the second pillar 42, and the third pillar 44 on the stopper 90. The stopper 90 on the first pillar 40, the second pillar 42, and the third pillar 44 is exposed by executing a chemical mechanical polishing (CMP). A hole 92 penetrating through the first insulator 70 and the second insulator 72 is formed on the wiring 2 by, for example, etching to expose the wiring 2. FIG. 6A is a schematic sectional view illustrating the memory device which is being manufactured. FIG. 6B is a schematic view illustrating the second insulator 72, the wiring 2, the first pillar 40, the second pillar 42, and the third pillar 44 when the memory device which is being manufactured, as illustrated in FIG. 6A, is viewed in the z-direction.

Figure 7A:
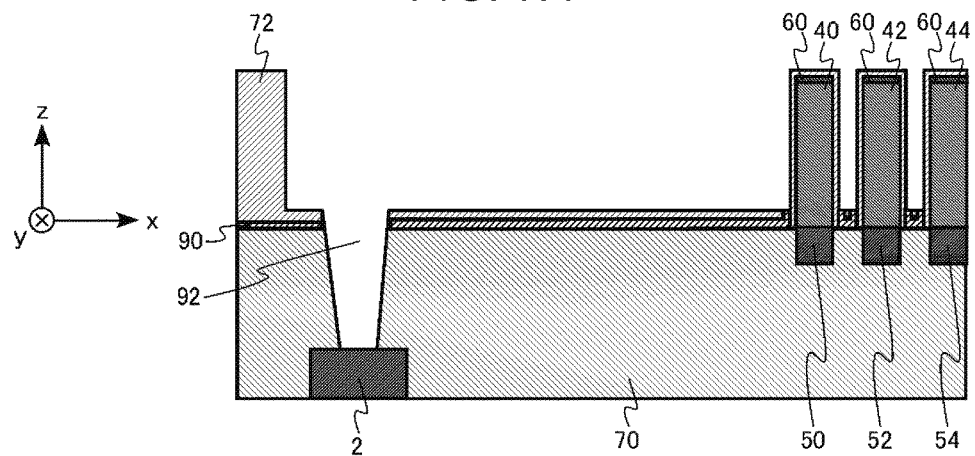
FIGS. 7A and 7B are schematic sectional views illustrating the memory device being manufactured by the method of manufacturing the memory device according to one or more embodiments.
Figure 7B:
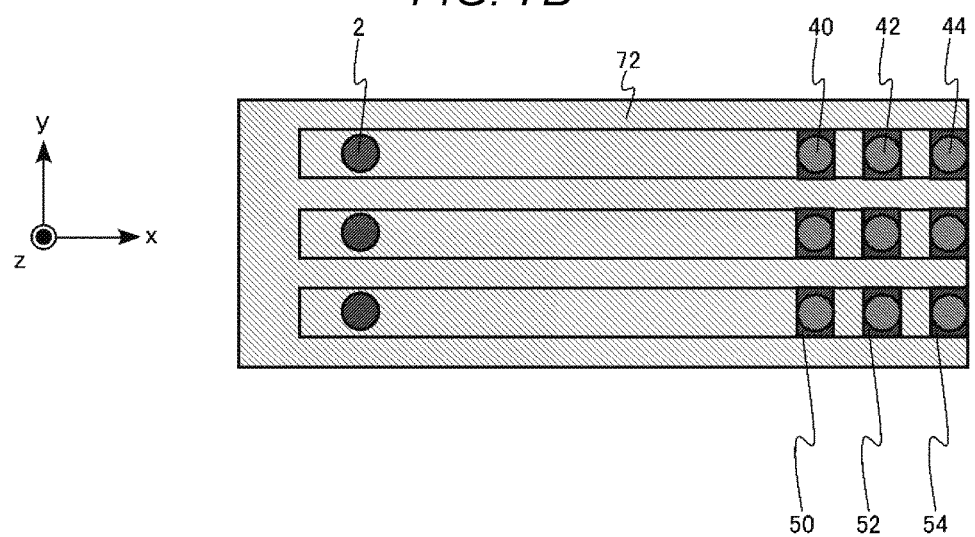

Referring now to FIG. 7A and FIG. 7B, parts of the second insulator 72 around the hole 92, the first pillar 40, the second pillar 42, and the third pillar 44 are removed. The stopper 90 on the first pillar 40, the second pillar 42, and the third pillar 44 is removed. FIG. 7A is a schematic sectional view illustrating the memory device which is being manufactured. FIG. 7B is a schematic view illustrating the second insulator 72, the wiring 2, the first pillar 40, the second pillar 42, the third pillar 44, the first conductive layer 50, the second conductive layer 52, and the fifth conductive layer 54 when the memory device which is being manufactured, as illustrated in FIG. 7A, is viewed in the z-direction.

The electrode 10 including a conductive material is formed, the electrode 10 including the first portion 10a provided on the wiring 2 and electrically connected to the wiring 2, and the second portion 10b provided on the first portion 10a, wherein the first pillar 40 and the second pillar 42 are provided inside the second portion 10b.

Here, when the electrode 10 is formed, the seventh conductive portion 24 including the first conductive material is formed on the surface of the second insulator 72 in a space created by removing a part of the second insulator 72. The first conductive portion 12 including the first conductive material is formed around the first pillar 40, the second conductive portion 14 including the first conductive material is formed around the second pillar 42, and the sixth conductive portion 22 including the first conductive material is formed around the third pillar 44. The fourth conductive portion 18 and the fifth conductive portion 20 electrically connected to the first conductive portion 12, the second conductive portion 14, and the sixth conductive portion 22 and including the first conductive material are formed so that the first pillar 40, the second pillar 42, the first conductive portion 12, the second conductive portion 14, and the sixth conductive portion 22 are provided between the fourth conductive portion 18 and the fifth conductive portion 20.

The third conductive portions 16 that include the second conductive material are formed around the first conductive portion 12, the second conductive portion 14, the fourth conductive portion 18, the fifth conductive portion 20, the sixth conductive portion 22, and the seventh conductive portion 24, and are electrically connected to the first conductive portion 12, the second conductive portion 14, the fourth conductive portion 18, the fifth conductive portion 20, the sixth conducive portion 22, and the seventh conductive portion 24.

For example, a part of an upper portion of the third conductive portion 16 is removed by CMP.

An upper portion of the second portion 10*b* and an upper portion of the second insulator 72 are removed so that upper portions of the first pillar 40, the second pillar 42, and the third pillar 44 are exposed.

Insulators including a silicon oxide or the like are formed in spaces formed by removing the upper portion of the second portion 10*b* and the upper portion of the second insulator 72.

The BL11 provided on the first pillar 40 and extending in the z-direction, the BL12 provided on the second pillar 42 and extending in the z-direction, the BL13 provided on the third pillar 44 and extending in the z-direction, and the variable resistance layers between the BLs are formed to obtain the memory device 100 according to one or more embodiments.

Next, operational effects according to one or more embodiments will be described.

As a memory device according to a comparative example, a memory device that does not include the third conductive portion 16 is considered. In this case, a gate drive voltage of a select transistor from the wiring 2 is applied through electric connection between the first conductive portion 12, the second conductive portion 14, the sixth conductive portion 22, and the seventh conductive portion 24 via the fourth conductive portion 18 and the fifth conductive portion 20.

However, the film thicknesses of the fourth conductive portion 18, the fifth conductive portion 20, and the seventh conductive portion 24 are generally thin and it is difficult to lower resistance to a desired amount.

In the memory device according to one or more embodiments described herein, the second portion 10*b* includes the first conductive portion 12, the second conductive portion 14, includes the second conductive material, and includes the third conductive portion 16 electrically connected to the first conductive portion 12 and the second conductive portion 14. The first portion 10*a* includes the second conductive material.

Thus, resistance between the wiring 2, the first conductive portion 12, the second conductive portion 14, and the sixth conductive portion 22 can be considerably reduced.

The second portion 10*b* further includes the fourth conductive portion 18 (that is electrically connected to the first conductive portion 12, the second conductive portion 14, the third conductive portion 16, and the sixth conductive portion 22 and contains the first conductive material) and the fifth conductive portion 20 (that is electrically connected to the first conductive portion 12, the second conductive portion 14, the third conductive portion 16, and the sixth conductive portion 22 and includes the first conductive material). To further reduce the resistance between the wiring 2, the first conductive portion 12, the second conductive portion 14, and the sixth conductive portion 22, the first pillar 40, the second pillar 42, the third pillar 44, the first conductive portion 12, the second conductive portion 14, the third conductive portion 16, and the sixth conductive portion 22 can be formed between the fourth conductive portion 18 and the fifth conductive portion 20.

To readily form the thin film transistors, the first pillar 40, the second pillar 42, and the third pillar 44 may include polycrystalline silicon.

To achieve good electric conductivity and prevent an undesirable reaction involving silicon, the first conductive material may include titanium nitride.

To reduce electric resistance, the second conductive material may include tungsten.

With the memory device according to one or more embodiments, it is possible to provide a memory device in which contact resistance is reduced.

In a comparative method of manufacturing the memory device, the hole 92 can be formed after the fourth conductive portion 18 and the fifth conductive portion 20 are formed. In such a case the fourth conductive portion 18 and the fifth conductive portion 20 might be damaged due to the formation of the hole 92, leading to a problem that resistance between the wiring 2, the first conductive portion 12, the second conductive portion 14, and the sixth conductive portion 22 increases.

In the method of manufacturing the memory device according to one or more embodiments described herein, the hole 92 penetrating through the first insulator 70 and the second insulator 72 is formed on the wiring 2 to expose the wiring 2. The electrode 10 is formed which includes the first portion 10*a* (that is provided on the wiring 2, includes the second conductive material, and is electrically connected to the wiring 2) and the second portion 10*b* (that is electrically connected to the first portion 10*a*, is provided on the first portion 10*a*, includes the second conductive material, includes the third conductive portion 16 electrically connected to the first conductive portion 12 and the second conductive portion 14, and in which the first pillar 40 and the second pillar 42 are provided).

In one or more embodiments of a manufacturing method described herein, the first portion 10*a* including the second conductive material and the second portion 10*b* that includes the third conductive portion 16 and includes the second conductive material can be formed after the hole 92 is formed. Therefore, it is possible to reduce the resistance between the wiring 2, the first conductive portion 12, the second conductive portion 14, and the sixth conductive portion 22 while still forming the hole 92.

To reduce the electric resistance, the second conductive material may include tungsten.

With the method of manufacturing the memory device according to one or more embodiments, it is possible to provide a method of manufacturing a memory device in which the contact resistance is reduced.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory device comprising:
    a wiring;
    an electrode that includes a first portion provided on the wiring and electrically connected to the wiring, and a second portion provided on and electrically connected to the first portion;
    a first pillar provided inside the second portion;
    a second pillar provided inside the second portion;
    a first conductive layer provided below the first pillar, extending in a first direction, and electrically connected to the first pillar; and
    a second conductive layer provided below the second pillar, extending in the first direction, and electrically connected to the second pillar,
    wherein the second portion of the electrode includes:
        a first conductive portion provided around the first pillar and comprising a first conductive material,
        a second conductive portion provided around the second pillar and comprising the first conductive material, and
        a third conductive portion provided around the first and second conductive portions, comprising a second conductive material, and electrically connected to the first and second conductive portions, and
    wherein the first portion of the electrode comprises the second conductive material.

2. The memory device according to claim 1,
    wherein the second portion further includes:
        a fourth conductive portion electrically connected to the first, second, and third conductive portions and comprising the first conductive material, and
        a fifth conductive portion electrically connected to the first, second, and third conductive portions and comprising the first conductive material, and
    wherein the first pillar, the second pillar, the first conductive portion, the second conductive portion, and the third conductive portion are provided between the fourth and fifth conductive portions.

3. The memory device according to claim 2, further comprising:
    a first gate insulating film provided between the first pillar and the first conductive portion; and
    a second gate insulating film provided between the second pillar and the second conductive portion.

4. The memory device according to claim 3,
    wherein the first and second pillars comprise polycrystalline silicon.

5. The memory device according to claim 4, further comprising:
    a third conductive layer provided on the first pillar and extending in a second direction intersecting the first direction;
    a fourth conductive layer provided on the second pillar and extending in the second direction; and
    a variable resistance layer provided between the third and fourth conductive layers.

6. The memory device according to claim 1, further comprising:
    a first gate insulating film provided between the first pillar and the first conductive portion; and
    a second gate insulating film provided between the second pillar and the second conductive portion.

7. The memory device according to claim 1,
    wherein the first and second pillars comprise polycrystalline silicon.

8. The memory device according to claim 1, further comprising:
    a third conductive layer provided on the first pillar and extending in a second direction intersecting the first direction;
    a fourth conductive layer provided on the second pillar and extending in the second direction; and
    a variable resistance layer provided between the third and fourth conductive layers.

9. The memory device according to claim 1,
    wherein the first conductive material comprises titanium nitride.

10. The memory device according to claim 1,
    wherein the second conductive material comprises tungsten.

11. A method of manufacturing a memory device, comprising:
    providing a wiring;
    forming a first insulator on the wiring;
    forming a first conductive layer extending in a first direction on the first insulator;
    forming a second conductive layer extending in the first direction on the first insulator;
    forming a first pillar electrically connected to the first conductive layer on the first conductive layer;

forming a second pillar electrically connected to the second conductive layer on the second conductive layer;

forming a second insulator around the first and second pillars;

forming a hole penetrating through the first and second insulators on the wiring to expose the wiring;

removing portions of the second insulator around the first and second pillars and around the hole;

forming a first conductive portion including a first conductive material around the first pillar;

forming a second conductive portion including the first conductive material around the second pillar; and forming an electrode which includes a first portion and a second portion, wherein the first portion is provided on the wiring and includes the second conductive material and is electrically connected to the wiring, and the second portion is provided on the first portion and includes a third conductive portion electrically connected to the first portion, includes the second conductive material, and is electrically connected to the first and second conductive portions, wherein the electrode is formed such that the first and second pillars are provided inside the second portion of the electrode.

12. The method according to claim 11, wherein the first and second pillars comprise polycrystalline silicon.

13. The method according to claim 11, wherein the first conductive material comprises titanium nitride.

14. The method according to claim 11, wherein the second conductive material comprises tungsten.

\* \* \* \* \*